United States Patent [19]

Kawaguchi

[11] Patent Number: 5,034,710

[45] Date of Patent: Jul. 23, 1991

[54] LC FILTER DEVICE HAVING MAGNETIC RESIN ENCAPSULATING MATERIAL

[75] Inventor: Masahiko Kawaguchi, Nagaokakyo, Japan

[73] Assignee: Murata Manufacturing Co., Ltd., Kyoto, Japan

[21] Appl. No.: 222,172

[22] Filed: Jul. 21, 1988

[30] Foreign Application Priority Data

Jul. 22, 1987 [JP] Japan .................................. 62-184530

[51] Int. Cl.$^5$ ........................ H03H 7/075; H05K 1/16
[52] U.S. Cl. ..................................... 333/185; 336/200
[58] Field of Search ................ 333/185, 184; 336/200, 336/232

[56] References Cited

U.S. PATENT DOCUMENTS

| | | | |
|---|---|---|---|
| 4,314,213 | 2/1982 | Wakino | 333/185 X |
| 4,320,364 | 3/1982 | Sakamoto et al. | 333/185 X |
| 4,591,814 | 5/1986 | Ito et al. | 333/185 X |
| 4,758,808 | 7/1988 | Sasaki et al. | 333/185 |

FOREIGN PATENT DOCUMENTS 196616 11/1984 Japan ...................................... 333/185

*Primary Examiner*—Eugene R. LaRoche
*Assistant Examiner*—Benny Lee
*Attorney, Agent, or Firm*—Wenderoth, Lind & Ponack

[57] ABSTRACT

An LC filter device includes a dielectric substrate having opposing sets of coil electrode patterns and capacitor electrode patterns. Each set of coil electrode patterns forms an inductive element, and each set of capacitor electrode patterns forms a capacitive element. The inductive and capacitive elements are interconnected to form an LC circuit configuration. The dielectric substrate is encapsulated by a resin coating. The resin coating includes a magnetic material, such as a high frequency ferrite powder, to increase the inductance of the LC filter and to reduce the stray capacitance of the LC filter.

2 Claims, 2 Drawing Sheets

LC FILTER DEVICE HAVING MAGNETIC RESIN ENCAPSULATING MATERIAL

BACKGROUND OF THE INVENTION

1. Field of the Invention

The present invention relates to an LC filter having printed coils, and more particularly to an LC filter which can be reduced in size without deteriorating the filter characteristics.

2. Description of the Related Art.

The LC filter is used mainly in high frequency circuits, such as FM receivers and televisions. Conventionally, the printed coils of such an LC filter are formed on an insulating substrate of alumina, mica or epoxy resin, or a magnetic substrate of a ferrite material.

The LC filter having the printed coils formed on the ferrite substrate can achieve a high inductance due to a high permeability of the ferrite material, but since the dielectric constant of the ferrite substrate is low, a capacitor must be formed of discrete parts, such as a plate type capacitor or chip parts, whereby the entire construction of the LC filter becomes larger. Also, when the insulating substrate is formed of alumina, mica or epoxy resin the capacitor must be formed of discrete parts.

On the other hand, in the filter using a dielectric of a high dielectric constant as the substrate, a capacitor having conductive patterns on both sides of the substrate can be formed, thereby effecting miniaturization of the LC filter, but the inductance of each printed coil becomes smaller due to the low permeability of the substrate.

In this case, to enlarge the inductance, the number of turns of the printed coils must be increased. Therefore, a dielectric substrate having a large surface area is required, whereby the entire construction of the LC filter device is enlarged. Furthermore, when the number of turns of the printed coils increases, a problem is created in that the filter characteristics are deteriorated due to stray capacitances formed by the dielectric constant of the dielectric substrate.

OBJECTS OF THE INVENTION

A first object of the invention is to provide an LC filter in which the inductance can be increased without increasing the number of turns of the printed coils to effectly miniaturize the entire component construction.

A second object of the invention is to provide an LC filter which, when miniaturized, does not deteriorate the filter characteristics, such as the Q-factor or the shaping factor.

A third object of the invention is to provide an LC filter which is hardly affected by external magnetic fields due to its magnetic shielding effect.

These and other objects of the invention will become more apparent in the detailed description and examples which follow.

DETAILED DESCRIPTION OF THE INVENTION

Figure 3:
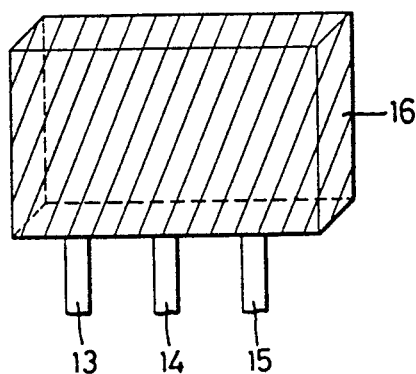
FIG. 3 is a perspective exterior view of the LC filter shown in FIGS. 1A & 1B, which is coated with resin.

Referring to FIG. 3, reference number 13 designates an input lead terminal, 14 designates an earth ground terminal, 15 designates an output lead terminal, these terminals 13, 14, 15 being derived from a filter body, and 16 designates a resin which coats the filter body and which includes a high frequency ferrite powder. The resin 16 is coated on the filter body by any well-known method, such as a dipping method. The resin 16 is coated on the filter body so as to enclose the entire filter body. Additionally, a ratio (weight %) of the high frequency ferrite powder contained in the resin is established in a range required to increase an inductance value of the printed coil provided in the filter body and to effectively magnetically shield the filter body, the ratio preferred being 50 to 90 wt. %. the rat The filter body, as shown in FIGS. 1A and 1B, is shown on a dielectric substrate 1.

Figure 1A:
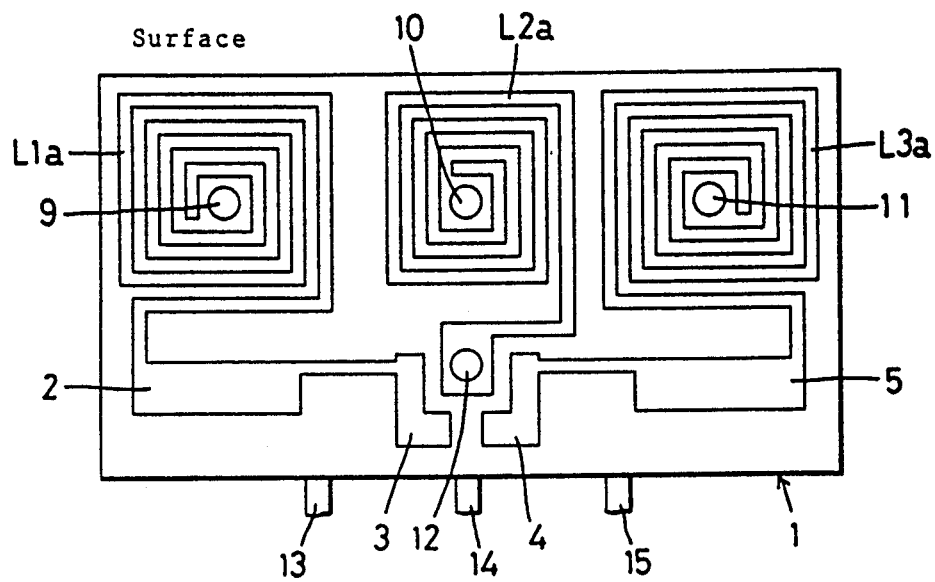
FIGS. 1A and 1B are views showing surface patterns of a substrate of an embodiment of an LC filter of the invention.
Figure 1B:
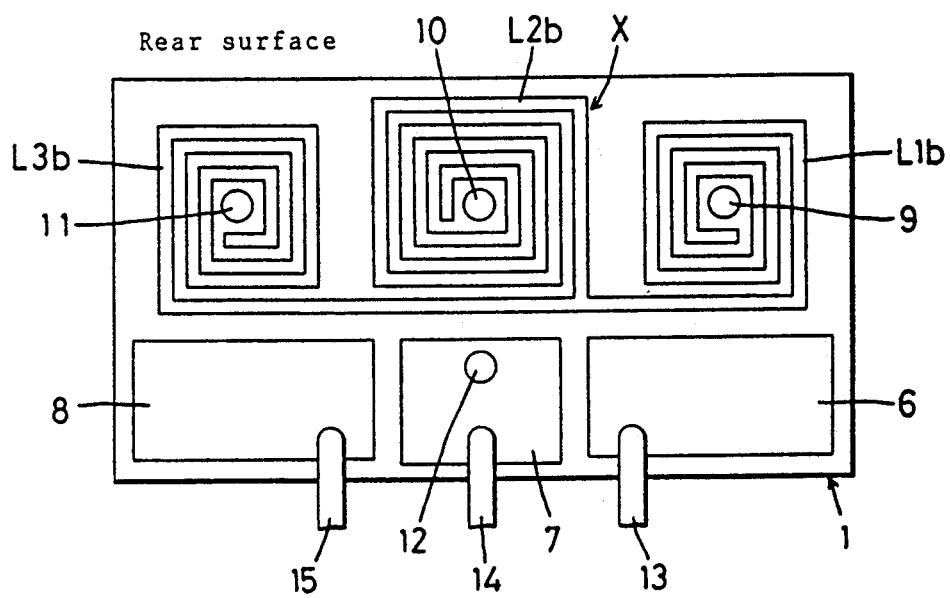

FIG. 1A shows the front surface of the substrate 1 and FIG. 1B the rear surface of the substrate 1. On the front surface of substrate 1 are formed three coil patterns L1a, L2a and L3a and four capacitor electrode patterns 2 through 5. On the other hand, on the rear surface of substrate 1 are formed three coil patterns L1b, L2b and L3b and three capacitor electrode patterns 6, 7 and 8.

The coil patterns L1a and L1b, L2a and L2b, and L3a and L3b are disposed opposite to each other on the surfaces of the substrate 1 and connected in series via through-bores 9, 10 and 11 formed at the center of each coil pattern. Each set of series connected coil patterns L1a and L1b, L2a and L2b, and L3a and L3b, has an inductance in proportion to the number of turns of each coil pattern and the permeability of the resin 16 which coats each set of coil patterns.

In addition, the respective coil patterns L1a and L1b, L2a and L2b, and L3a and L3b disposed opposite to each other on both sides of the substrate 1 are wound in the same directions, thereby offsetting any mutual inductance between two coil patterns.

The coil pattern L1a on the front surface of the substrate 1 is connected at one end to the capacitor electrode pattern 2, the coil pattern L2a is connected at one end to the capacitor electrode pattern 7 on the rear surface of the substrate 1 via a through-bore 12, and the coil pattern L3a is connected a one end to the capacitor electrode pattern 5.

The coil patterns L1b, L2b and L3b on the rear surface of the substrate 1 are connected at one end to each other at the position X shown in FIG. 1B.

The capacitor electrode pattern 2 on the front surface of the substrate 1 is connected to the capacitor electrode pattern 3 and is opposite the capacitor electrode pattern 6 on the rear surface of the substrate 1, thereby constituting a first capacitor having an electrostatic capacitance in accordance with the opposing surface areas, the thickness of the substrate 1 and the particular dielectric of the substrate 1. Additionally, the capacitor electrode patterns 3 and 4 are opposite the capacitor electrode pattern 7 on the rear surface of substrate 1 to constitute second and third capacitors of a predetermined capacitance. The capacitor electrode pattern 5 is connected to the capacitor electrode pattern 4 and is opposite the capacitor electrode pattern 8 on the rear surface of the substrate 1 so as to constitute a fourth capacitor of a predetermined capacitance.

In addition, the capacitor electrode pattern 6 on the rear surface of the substrate 1 is connected to the input lead terminal 13, the capacitor electrode pattern 7 is connected to the earth ground terminal 14, the capacitor electrode pattern 8 is connected to the output lead terminal 15.

Figure 2:
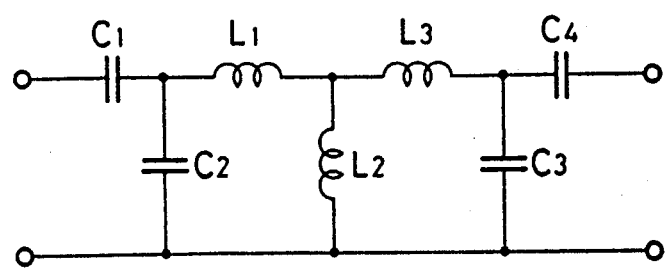
FIG. 2 is a circuit diagram of an equivalent circuit of the LC filter shown in FIGS. 1A & 1B.

The LC filter of the above-mentioned construction can be represented as the equivalent circuit shown in FIG. 2.

In FIG. 2, L1 is formed of the coil patterns L1a and L1b, L2 is formed of the coil patterns L2a and L2b, and L3 is formed of the coil patterns L3a and L3b, and C1 is formed of the capacitor electrode patterns 2 and 6, C2 is formed of the capacitor electrode patterns 3 and 5, C3 is formed of the capacitor electrode patterns 4 and 7, and C4 is formed of the capacitor electrode patterns 5 and 8.

Figure 4:
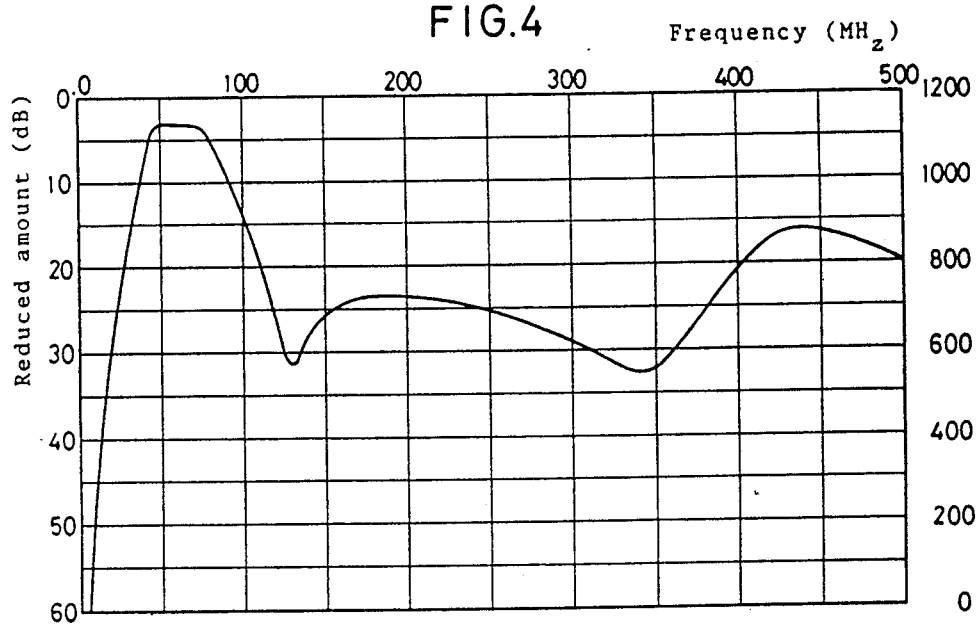
FIG. 4 is a view of the frequency characteristics of the LC filter coated with resin containing ferrite powder of the present invention.
Figure 5:
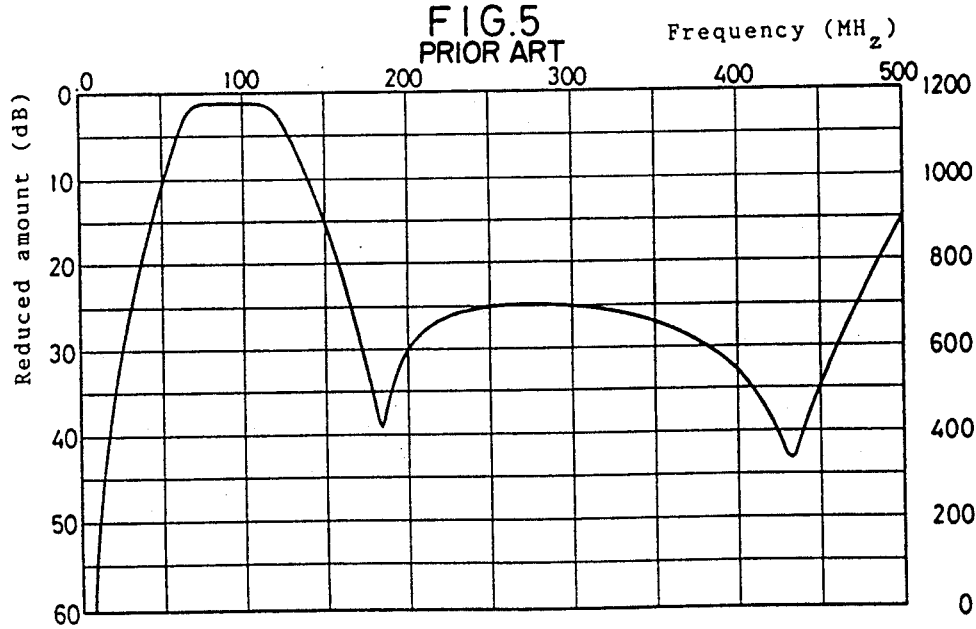
FIG. 5 is a frequency characteristic view of the LC filter externally coated with the conventional resin

FIG. 5 shows the frequency characteristics of the LC filter when coated with a resin containing no ferrite material (the conventional example), and FIG. 4 shows the same when the LC filter is coated with a resin including a high frequency ferrite powder (the present invention). The LC filters having the characteristics shown in FIGS. 4 and 5 are different from each other with respect to the coated resin only, and have the same internal electrode and coil patterns. In comparing these drawings, it can be seen that the peak of attenuation is in the vicinity of 100 MHz in FIG. 5 and is in the vicinity of 60 MHz in FIG. 4. Accordingly, when a resin having a ferrite powder of magnetic material is used as the coating, it is apparent as shown in FIG. 4 that the band pass frequency moves toward the lower frequency, which is assumed to increase inductance of the printed coil.

In other words, since the ferrite powder in the coated resin reduces the leakage of the magnetic flux, the inductance becomes larger while maintaining the smaller number of turns of the conventional printed coil, the stray capacitance is reduced, and the configuration of the substrate remains unchanged. Therefore, in order to enlarge the inductance, there is no need of enlarging the size of the device according to the present invention. Thus, the entire LC filter can be reduced in size, and in order to obtain the same prior inductance value, each printed coil may be reduced in the number of turns thereof, thereby effecting miniaturization of the LC filter.

Since the stray capacitance is reduced, the filter characteristic, such as the Q-factor or the shaping factor and the frequency characteristic, are prevented from deterioration. In addition, since the magnetic flux is less expanded, the LC filter is less affected by external magnetism, thereby enabling a shielding effect to be obtained.

As seen from the above, the band-pass filter (LC filter) in FIG. 1 is described as the embodiment of the invention, but the present invention may of course be applicable to a low-pass filter, a high-pass filter or a band elimination filter circuit. In addition, the embodiment uses ferrite powder of ferromagnetic material as the magnetic material to be used in resin. However, other ferromagnetic materials may be used, such as iron, PERMALLOY, (trade name) or the like.

While an embodiment of the invention has been shown and described, the invention is not limited to the specific construction thereof, since the embodiment is merely exemplary of the present invention.

What is claimed is:

1. An LC filter device comprising:
a dielectric substrate having opposite first and second surfaces;
at least one set of opposing coil electrode patterns respectively located on said first and second surfaces of said dielectric substrate, each of said at least one set of opposing coil electrode patterns forming a corresponding inductive element;
at least one set of opposing capacitor electrode patterns respectively located on said first and second surfaces of said dielectric substrate, each of said at least one set of opposing capacitor electrode patterns forming a corresponding capacitive element;
first, second and third terminals;
means for electrically and operatively interconnecting said at least one set of opposing coil electrode patterns and said at least one set of opposing capacitor electrode patterns to said first, second and third terminals so as to form a predetermined LC filter circuit configuration made up of the inductive and capacitive elements respectively formed by said at least one set of opposing coil electrode patterns and said at least one set of opposing capacitor electrode patterns;
a resin coating encapsulating said dielectric substrate, said resin including a magnetic material so as to increase an inductance of the LC filter device, said magnetic material being 50 to 90% by weight of said resin.

2. An LC filter device as recited in claim 1, said magnetic material being a high frequency ferrite powder.

* * * * *